(12) United States Patent
Wong

(10) Patent No.: US 9,172,374 B2
(45) Date of Patent: Oct. 27, 2015

(54) VOLTAGE LEVEL TRANSLATOR

(71) Applicant: NXP B.V., Eindhoven (NL)

(72) Inventor: Hok-tung Wong, Maricopa, AZ (US)

(73) Assignee: NXP B.V., Eindhoven (NL)

( * ) Notice: Subject to any disclaimer, the term of this patent is extended or adjusted under 35 U.S.C. 154(b) by 23 days.

(21) Appl. No.: 14/103,749

(22) Filed: Dec. 11, 2013

(65) Prior Publication Data

US 2014/0347115 A1 Nov. 27, 2014

Related U.S. Application Data

(60) Provisional application No. 61/825,613, filed on May 21, 2013.

(51) Int. Cl.
  *H03L 5/00* (2006.01)
  *H03K 19/0175* (2006.01)
  *H03K 19/0185* (2006.01)

(52) U.S. Cl.
  CPC .............. *H03K 19/017509* (2013.01); *H03K 19/018521* (2013.01)

(58) Field of Classification Search
  None
  See application file for complete search history.

(56) References Cited

U.S. PATENT DOCUMENTS 7,466,168 B1 * 12/2008 Wittenbreder, Jr. ............ 327/108
2006/0139086 A1 * 6/2006 Heinz et al. .................... 327/333

* cited by examiner

*Primary Examiner* — Lincoln Donovan
*Assistant Examiner* — Khareem E Almo

(57) ABSTRACT

A voltage level translator includes an inverter circuit configured to switch an output of the inverter circuit between a first voltage level and a second voltage level. The voltage level translator also includes a capacitor connected to the output of the inverter circuit. The voltage level translator also includes a load connected to the capacitor. The capacitance of the capacitor is approximately 10 times larger than a capacitance of the load. An output signal of the voltage level translator has at least one of a different voltage swing and a different voltage domain than an input signal to the inverter circuit.

20 Claims, 5 Drawing Sheets

VOLTAGE LEVEL TRANSLATOR

This application is entitled to the benefit of provisional U.S. Patent Application Ser. No. 61/825,613, filed May 21, 2013, the disclosure of which is incorporated by reference herein in its entirety.

Voltage level translation allows devices or applications built from different processing technologies and having different voltage requirements to interface with each other, specifically in integrated circuits. The voltage requirements for each device may include supply voltages, input voltage thresholds, and achievable output voltage levels. For example, a device with a low input voltage threshold or a specific supply voltage may need to communicate with or otherwise interface with a device with a higher input voltage threshold or different supply voltage.

Embodiments of a voltage level translator are disclosed. In one embodiment, the voltage level translator includes an inverter circuit configured to switch an output of the inverter circuit between a first voltage level and a second voltage level. The voltage level translator also includes a capacitor connected to the output of the inverter circuit. The voltage level translator also includes a load connected to the capacitor. The capacitance of the capacitor is approximately 10 times larger than a capacitance of the load. An output signal of the voltage level translator has at least one of a different voltage swing and a different voltage domain than an input signal to the inverter circuit.

In another embodiment of the voltage level translator, the voltage level translator includes an inverter having a pair of transistors. The inverter is configured to switch an output of the inverter between a first voltage level and a second voltage level. The voltage level translator also includes a capacitor having a first end connected to the output of the inverter. The voltage level translator also includes a first transistor having a gate connected to a second end of the capacitor. A capacitance of the capacitor is approximately 10 times larger than a capacitance of the first transistor. An output signal at a drain of the first transistor has a different voltage swing than an input signal to the inverter.

In another embodiment of the voltage level translator, the voltage level translator includes an inverter having a pair of transistors. The inverter is configured to switch an output of the inverter between a first voltage level and a second voltage level. The voltage level translator also includes a capacitor having a first end connected to the output of the inverter and a second end connected to a load. A capacitance of the capacitor is approximately 10 times larger than a capacitance of the load. An output signal at the load comprises a different voltage domain than an input signal to the inverter. Other embodiments of the device, circuit, and method are also described.

Other aspects in accordance with the invention will become apparent from the following detailed description, taken in conjunction with the accompanying drawings, illustrated by way of example of the principles of the invention.

Throughout the description, similar reference numbers may be used to identify similar elements.

Figure 1:
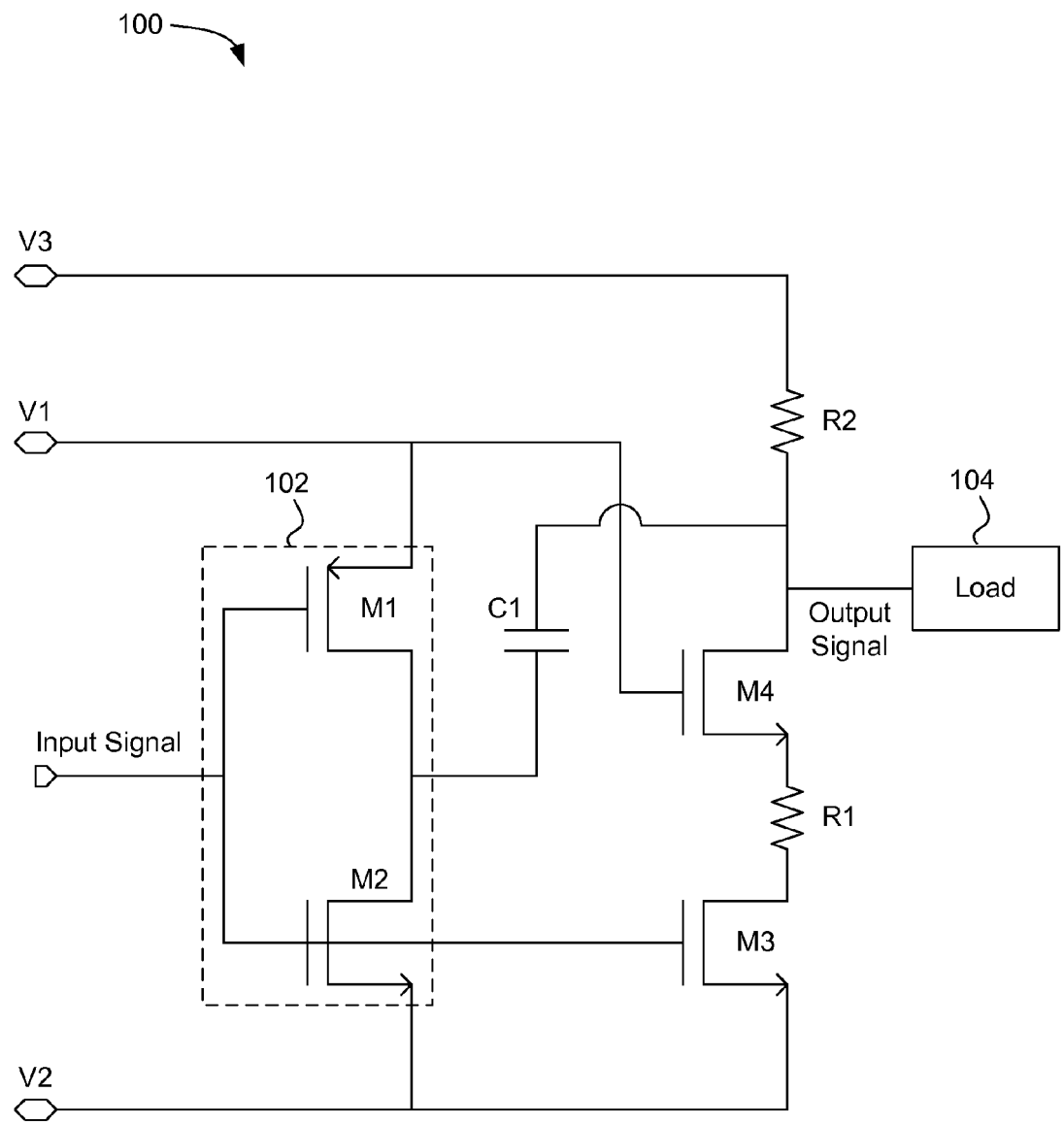
FIG. 1 depicts a schematic diagram of one embodiment of a voltage level translator.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

While many embodiments are described herein, at least some of the described embodiments present a voltage level translator. Specifically, the voltage level translator is configured to output a signal that has either a different voltage domain or a different voltage swing (or both) than an input signal. The voltage level translator receives an input signal to an inverter circuit. A capacitor is connected to the output of the inverter circuit at one end of the capacitor and a load at the other end of the capacitor, which is at the output of the voltage level translator. In one embodiment, the load is a loading circuit connected to the voltage level translator, and a capacitance of the capacitor is selected to be approximately ten times as large as the capacitance of the loading circuit. In another embodiment, the gate of a transistor is connected to the capacitor. The capacitance of the capacitor is approximately ten times as large as the capacitance of the transistor. The output signal is at the drain of the transistor.

The rise and fall times of the output signal are the rate at which the output signal swings between a high voltage level and a low voltage level. The rise and fall delays are the rate at which changes in the input signal are translated to the output signal. Conventional level translators typically have unequal rise and fall times in the output signal, and long rise and fall delays. Specifically, conventional level translators generally have a much slower rise time than fall time in the output signal. As a result, the rise delay is much longer than the fall delay. Longer rise delays result in a total delay that may not be acceptable for certain applications and may require additional circuits (such as a non-overlapping circuit control) to prevent system-level shoot-through current due to the unequal rise/fall time. The additional circuits also introduce additional delay. Consequently, a level translator having equal rise and fall times, equal rise and fall delays, and fast rise and fall delays may improve the total propagation delay and reduce the amount of circuits required. The level translator described herein may also have low current consumption from power supplies and operate in a wide range of power supplies.

FIG. 1 depicts a schematic diagram of one embodiment of a voltage level translator 100. The voltage level translator 100 depicted in FIG. 1 may include more components than those explicitly described. Additionally, while the components in the voltage level translator 100 of FIG. 1 may be described as having specific values, the values for the components may have any values in accordance with the principles described herein.

In one embodiment, the voltage level translator 100 is configured to produce an output signal with a different voltage domain than an input signal. For example, the input signal may have a voltage swing from 0 volts (V) to 3V, and the output signal may have a voltage swing from 13V-16V. The voltage swing may be the same from the input signal to the output signal, but the voltage domain is different. In the previous example, the output signal does not overlap the input signal. In other embodiments, the output signal may overlap the input signal. For example, the input signal may have a voltage swing from 0V-3V and the output signal may have a voltage swing from 2.5V-5.5V. The output signal may be periodic, based on the input signal.

In the present embodiment, the voltage level translator receives the input signal into an inverter circuit 102 (also referred to herein as an inverter). The inverter 102 may be a complementary metal-oxide-semiconductor (CMOS) inverter 102 which includes two transistors M1, M2. Transistor M1 is a p-type transistor, and transistor M2 is an n-type transistor. The source of transistor M1 is connected to a supply voltage V1. The source of transistor M2 is connected to a supply voltage V2. In one embodiment, supply voltage V2 is ground. The drain of transistor M1 is connected to the drain of transistor M2.

The voltage level translator 100 also includes transistor M3 and transistor M4. The gate of transistor M3 is connected to the input signal, such that the voltage at the gates of transistors M1, M2 is the voltage at the gate of transistor M3. The source of transistor M3 is connected to supply voltage V2. A resistor R1 is connected to the drain of transistor M3. The gate of transistor M4 is connected to supply voltage V1. The source of transistor M4 is connected to resistor R1, and the drain of transistor M4 is connected to the load 104 at the output. Resistor R2 connects supply voltage V3 to the load 104 and to the drain of transistor M4. The voltage level translator also includes a capacitor C1 that connects the output of the inverter 102 to the load 104. Transistors M3, M4 are n-type transistors.

Transistor M4 is positioned so that changes in supply voltage V3 do not affect the structure of the voltage level translator 100. Without transistor M4, the ratio of resistor R2 and resistor R1 would have to be adjusted for different voltages from supply voltage V3. With transistor M4, the translator 100 works for any value of supply voltage V3 as long as the voltage of supply voltage V3 is greater than the voltage of supply voltage V1.

The input signal may act as a drive signal for the inverter 102, such that when the input signal is low, the output of the inverter 102 is supply voltage V1. When the input signal is high, the output of the inverter 102 is supply voltage V2. In one embodiment, the input signal has a voltage swing between supply voltage V1 and supply voltage V2, such that the voltage level at the output of the inverter 102 is opposite the voltage value of the input signal.

When the input signal is low, transistor M3 is off and does not conduct current from supply voltage V2 to the output. Because no current is conducted from supply voltage V2 to the output, there is no current going through resistor R2, and therefore no voltage drop across resistor R2, and the voltage value at the output is the voltage value of supply voltage V3. For example, if supply voltage V3 has a voltage of 16V, the output signal also has a voltage of 16V.

When the input signal is high, transistor M3 is on and conducts current from supply voltage V2 to the output. The values for resistors R1, R2 are selected to produce a voltage drop from supply voltage V3 to the output that is equal to the voltage swing of the input. For example, if supply voltage V3 has a voltage of 16V, and the voltage swing of the input signal is 3V (from 0V-3V), the output signal has a voltage of 13V. Thus, as the input signal swings between 0V and 3V, the output signal swings between 13V and 16V, changing the voltage domain, but maintaining the same voltage swing.

Because the load 104 has a corresponding capacitance, the rate at which the output signal transitions between the higher voltage level and the lower voltage level may be adversely affected. Capacitor C1 is selected to have a capacitance that is much larger than the load capacitance to maintain sufficient swing between the higher voltage level and the lower voltage level. If the capacitance of capacitor C1 is sufficiently larger than the capacitance of the load 104, capacitor C1 may be used to charge the capacitance of the load 104 faster, resulting in a faster transition between the higher voltage level and the lower voltage level at the output. In one embodiment, the capacitance of capacitor C1 is approximately ten times as large as the capacitance of the load 104. For example, if the capacitance of the load 104 is 1.5 picofarads (pf), capacitor C1 is selected to have a capacitance of approximately 15 pf. In one embodiment, the capacitance of capacitor C1 is 18.5 pf, though the capacitance may be selected to produce a different output signal. In one embodiment, approximately includes a capacitance of capacitor C1 that is nine to eleven times as large as the capacitance of the load 104. In another embodiment, approximately includes a capacitance of capacitor C1 that is eight to twelve times as large as the capacitance of the load 104. In another embodiment, approximately includes a capacitance of capacitor C1 that is an order of magnitude larger than the capacitance of the load 104. In another embodiment, approximately includes a capacitance of capacitor C1 that is at least ten times as large as the capacitance of the load 104.

As described above the voltage swing for the output signal is the same as for the input signal in the embodiment of FIG. 1. When the input signal has a voltage of 0V, the output of the inverter 102 is 3V, and the output signal of the voltage level translator 100 is 16V because there is no current through resistor R2. When the input signal has a voltage of 3V, the output of the inverter 102 is 0V, and the output signal of the voltage level translator 100 is 13V because current flows through resistors R1, R2. The voltage change across the capacitor (or voltage stored in the capacitor) remains constant at 13V. The voltage stored in the capacitor allows the capacitance at the load 104 to be quickly charged/discharged, which allows the voltage at the output signal to transition quickly in response to changes in the input signal, resulting in a low rise/fall delay and an equal rise/fall time. In one embodiment, the voltage level translator 100 also has a low propagation delay, for example, much less than 1 nanosecond (ns).

Figure 2:
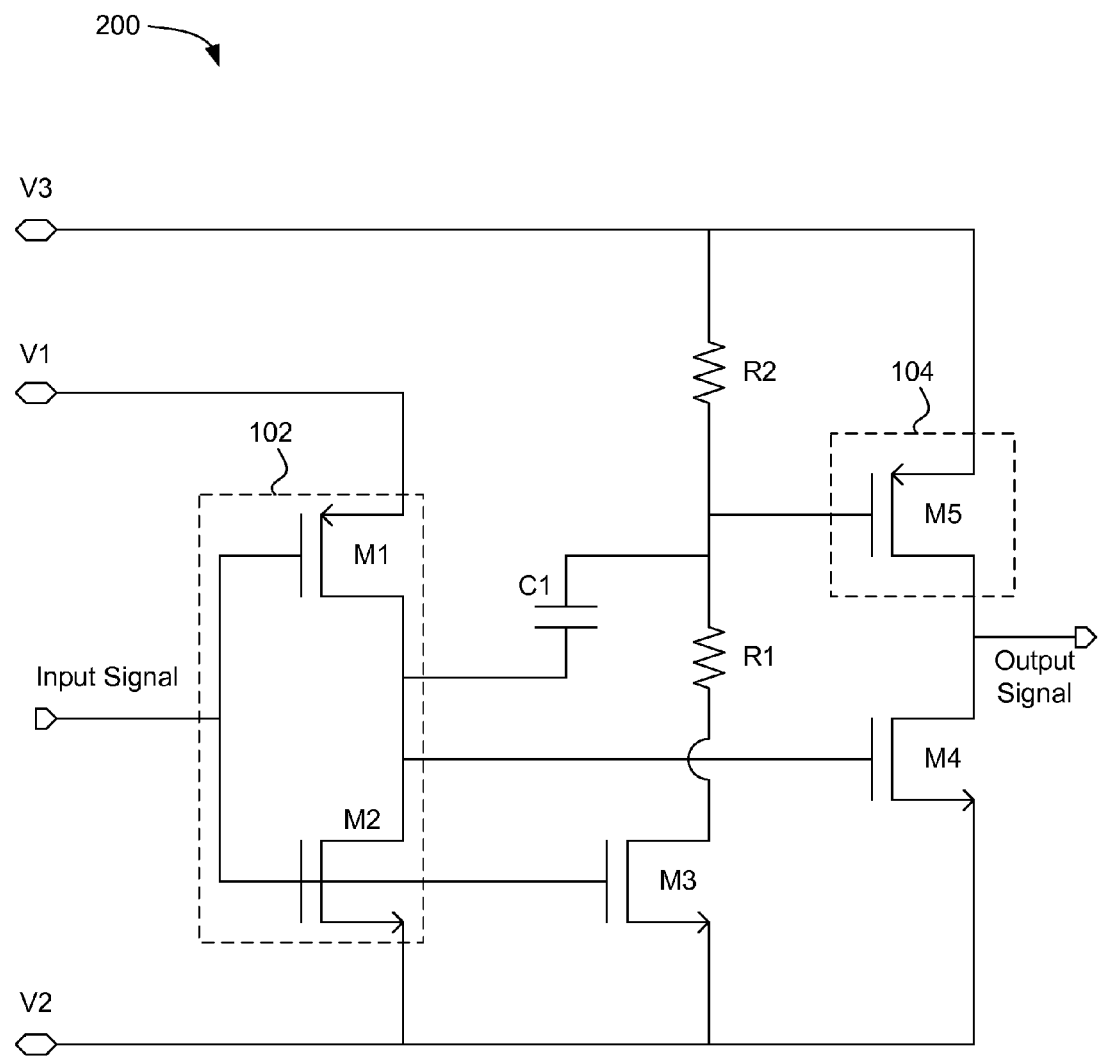
FIG. 2 depicts a block diagram of another embodiment of a voltage level translator.

FIG. 2 depicts a block diagram of another embodiment of a voltage level translator 200. The voltage level translator 200 depicted in FIG. 2 may include more components than those explicitly described. Additionally, while the components in the voltage level translator 200 of FIG. 2 may be described as having specific values, the values for the components may have any values in accordance with the principles described herein.

In one embodiment, the voltage level translator 200 is configured to change a voltage swing of the input signal to the output signal. The voltage level translator 200 includes an inverter 102 as described in conjunction with the voltage level translator 100 of FIG. 1. For example, the input signal may have a voltage swing of 0V-1.8V, and the voltage level translator 200 may output a signal with a voltage swing of 0V-3V. In one embodiment, the input signal is in the same voltage domain as the output signal, such that the output signal may overlap the input signal but with a different voltage swing.

The voltage level translator 200 also includes transistor M3, transistor M4, and transistor M5. The gate of transistor M3 is connected to the input signal, such that the voltage at the gates of transistors M1, M2 is the voltage at the gate of transistor M3. The source of transistor M3 is connected to supply voltage V2. A resistor R1 is connected to the drain of transistor M3. Resistor R2 connects supply voltage V3 to transistor M5 and to resistor R1. The gate of transistor M4 is connected to the output of the inverter 102, and the source of transistor M4 is connected to supply voltage V2. The voltage level translator 200 also includes a capacitor C1 that connects the output of the inverter 102 to the transistor M5, such that the gate of transistor M5 is connected to the capacitor. The source of transistor M5 is connected to supply voltage V3 and the drain of transistor M5 is connected to the drain of transistor M4 at the output of the voltage level translator 200. Transistors M3, M4 are n-type transistors and transistor M5 is a p-type transistor.

When the input signal is low, transistor M3 is off and does not conduct current from supply voltage V2 to the gate of transistor M5. Because no current is conducted from supply voltage V2 to the gate of transistor M5, there is no voltage drop across resistor R2, and the voltage value at the gate of transistor M5 is the voltage value of supply voltage V3, turning transistor M5 off. When the input signal is low, the output of the inverter 102 has a voltage value of supply voltage V1, for example 1.8V. Thus, the voltage across capacitor C1 is equal to the voltage at the gate of transistor M5 minus the voltage value at the output of the inverter 102. For example, if supply voltage V3 has a voltage of 3V and supply voltage V1 has a voltage of 1.8V, the voltage across capacitor C1 is 1.2V because the voltage value at the gate of transistor M5 is 3V and the inverter 102 output is 1.8V. Additionally, the output of the inverter 102 is high and transistor M4 is on, such that the output of the voltage level translator 200 is supply voltage V2—for example, the output signal is 0V if supply voltage V2 is ground.

When the input signal is high, transistor M3 is on and conducts current from supply voltage V2 to the gate of transistor M5. The values for resistors R1, R2 are selected to produce a voltage drop from supply voltage V3 to the gate of transistor M5 that is equal to supply voltage V3 minus supply voltage V1. For example, if supply voltage V3 has a voltage of 3V and supply voltage V1 has a voltage of 1.8V, the voltage value at the gate of transistor M5 is 1.2V. Because the inverter 102 output is 0V, the voltage across capacitor C1 is still 1.2V. Transistor M5 is configured to conduct current when the voltage at the gate of transistor M5 is V3-V1. Transistor M4 is off when the output of the inverter 102 is low, and the output of the voltage level translator 200 is equal to supply voltage V3.

Because transistor M5 has a corresponding capacitance, the swing at which the output signal transitions between the higher voltage level and the lower voltage level may be adversely affected. Capacitor C1 is selected to have a capacitance that is much larger than the capacitance of transistor M5 to allow the output signal to adequately transition between the higher voltage level and the lower voltage level. In one embodiment, the capacitance of capacitor C1 is approximately ten times as large as the capacitance of transistor M5, though the capacitance of capacitor C1 may be much larger than ten times the capacitance of transistor M5.

The voltage across the capacitor (or voltage stored in the capacitor) remains constant. The voltage stored in the capacitor allows the capacitance at transistor M5 to be quickly charged/discharged, which allows the voltage at the gate of transistor M5 to transition quickly in response to changes in the input signal, resulting in a low rise/fall delay and an equal rise/fall time at the output signal. In one embodiment, the voltage level translator 200 also has a low propagation delay, for example, much less than 1 nanosecond (ns).

In one embodiment, the voltage swing of the input signal is in phase with the voltage swing of the output signal. In other embodiments, the input signal may be out of phase with the output signal. The supply voltages may have any voltage value corresponding to the input signal and the desired output signal. Additionally, the transistors may be configured to operate in accordance with the principles described herein depending on the supply voltages, input signal, and desired output signal.

Figure 3:
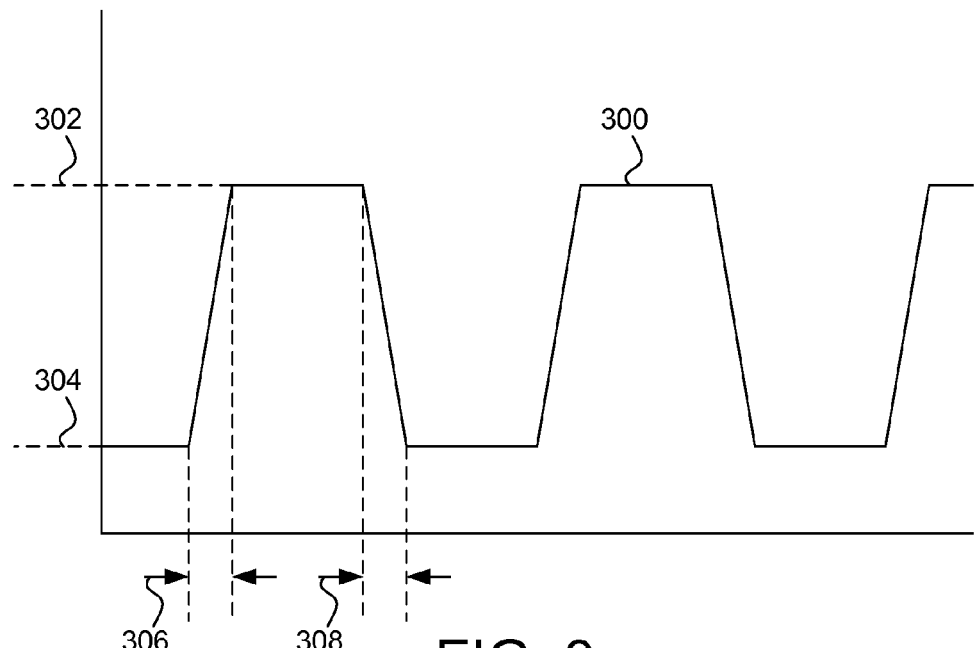
FIG. 3 depicts a graph diagram of an input signal to the voltage level translator.

FIG. 3 depicts a graph diagram of an input signal 300 to a voltage level translator. While the input signal 300 is described in conjunction with the voltage level translators of FIGS. 1 and 2, the input signal 300 may be used in conjunction with any voltage level translator according to the principles described herein.

The input signal 300 is input into the voltage level translator at an inverter 102. The input signal 300 includes a voltage swing between a high voltage level 302 and a low voltage level 304. The input signal 300 may be an output of another circuit or component, which may be part of a larger application with the voltage level translator. The input signal 300 also operates in a predetermined voltage domain, which may be determined by the low voltage level 304 or the high voltage level 302 in the input signal 300. The input signal 300 may also be periodic according to predetermined timing. The rise times 306 and fall times 308 between the high voltage level 302 and the low voltage level 304 may be equal.

Figure 4:
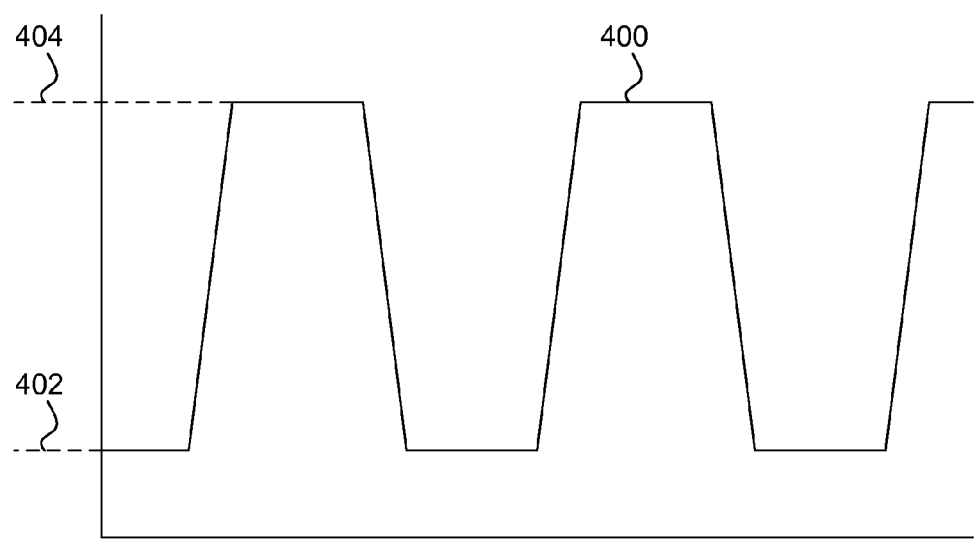
FIG. 4 depicts a graph diagram of an output signal from a voltage level translator.

FIG. 4 depicts a graph diagram of an output signal 400 from a voltage level translator. While the output signal 400 is described in conjunction with the voltage level translators of FIGS. 1 and 2, the output signal 400 may be used in conjunction with any voltage level translator according to the principles described herein.

The output signal 400 is obtained at the output of the voltage level translator. In one embodiment, the output signal 400 operates in the same voltage domain as the input signal 300 and overlaps the input signal 300. In one embodiment, the output signal 400 has a different voltage swing from a low voltage level 402 to a high voltage level 404 than the input signal 300. For example, if the input signal 300 has a voltage swing from 0V-1.8V, the output signal 400 may have a voltage swing from 0V-3V. In another embodiment, the output signal 400 has the same voltage swing as the input signal 300, but operates in a different voltage domain than the input signal 300. For example, if the input signal has a voltage swing from 0V-3V, the output signal may have a voltage swing from 13V-16V.

Figure 5:
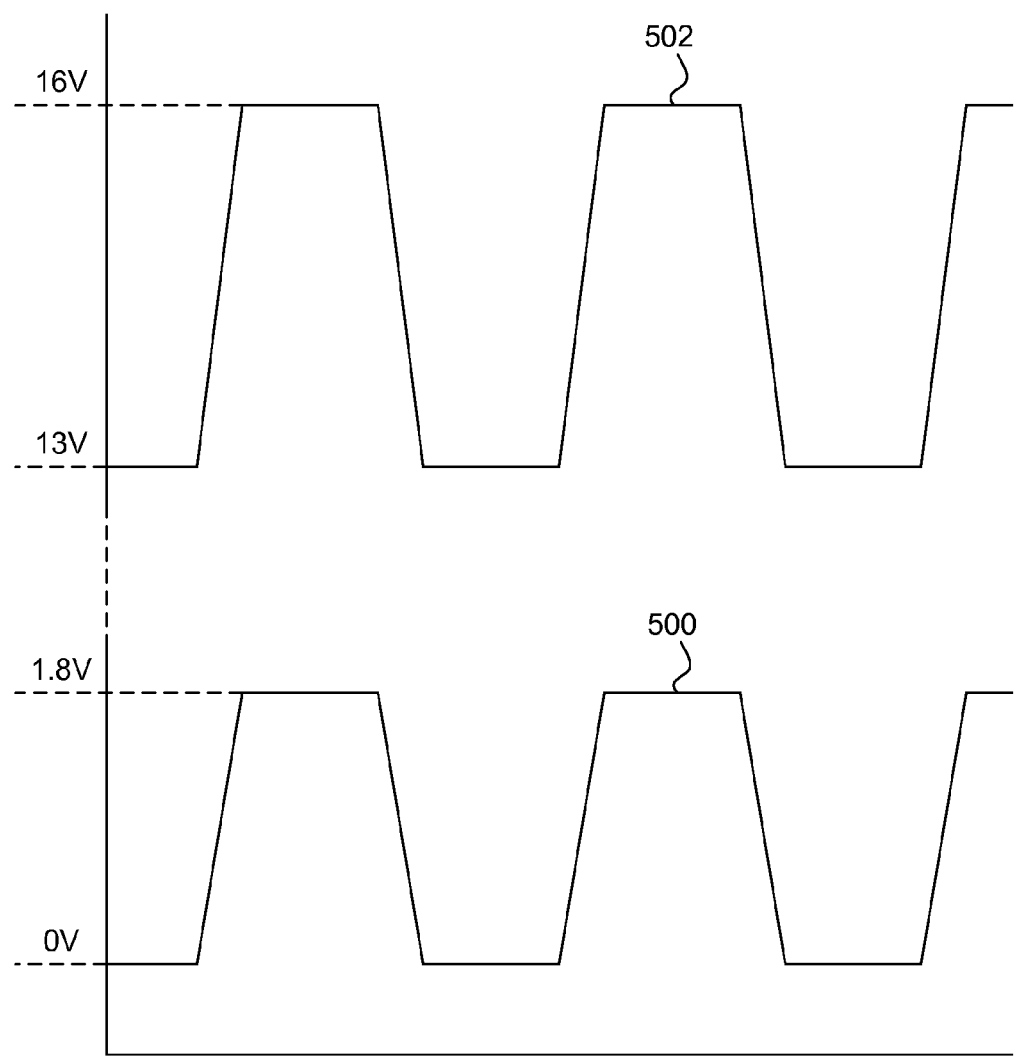
FIG. 5 depicts a graph diagram of an input signal and an output signal from a voltage level translator.

FIG. 5 depicts a graph diagram of an input signal 500 and an output signal 502 from a voltage level translator. While the input signal 500 and output signal 502 are described in conjunction with the voltage level translators of FIGS. 1 and 2, the input signal and output signal may be used or produced in conjunction with any voltage level translator according to the principles described herein.

The output signal 502 may have a different voltage swing and operates in a different voltage domain than the input signal 500. For example, the input signal 500 has a voltage swing from 0V-1.8V, and the output signal 502 has a voltage swing from 13V-16V. The voltage swing of the input signal 500 is 1.8V, and the output signal operates at a higher voltage level with a 3V voltage swing. In one embodiment, the different voltage swing is obtained by inputting the input signal 500 into a first voltage level translator, and the voltage domain is changed by inputting the output of the first voltage level translator into a second voltage level translator. In another embodiment, the voltage swing and voltage domain are changed by using a single voltage level translator operating according to principles described in conjunction with the voltage level translators of FIGS. 1 and 2. Furthermore, the output signal 502 may be out of phase with respect to the input signal 500, or a certain amount of delay may exist between input signal 500 and output signal 502.

Figure 6:
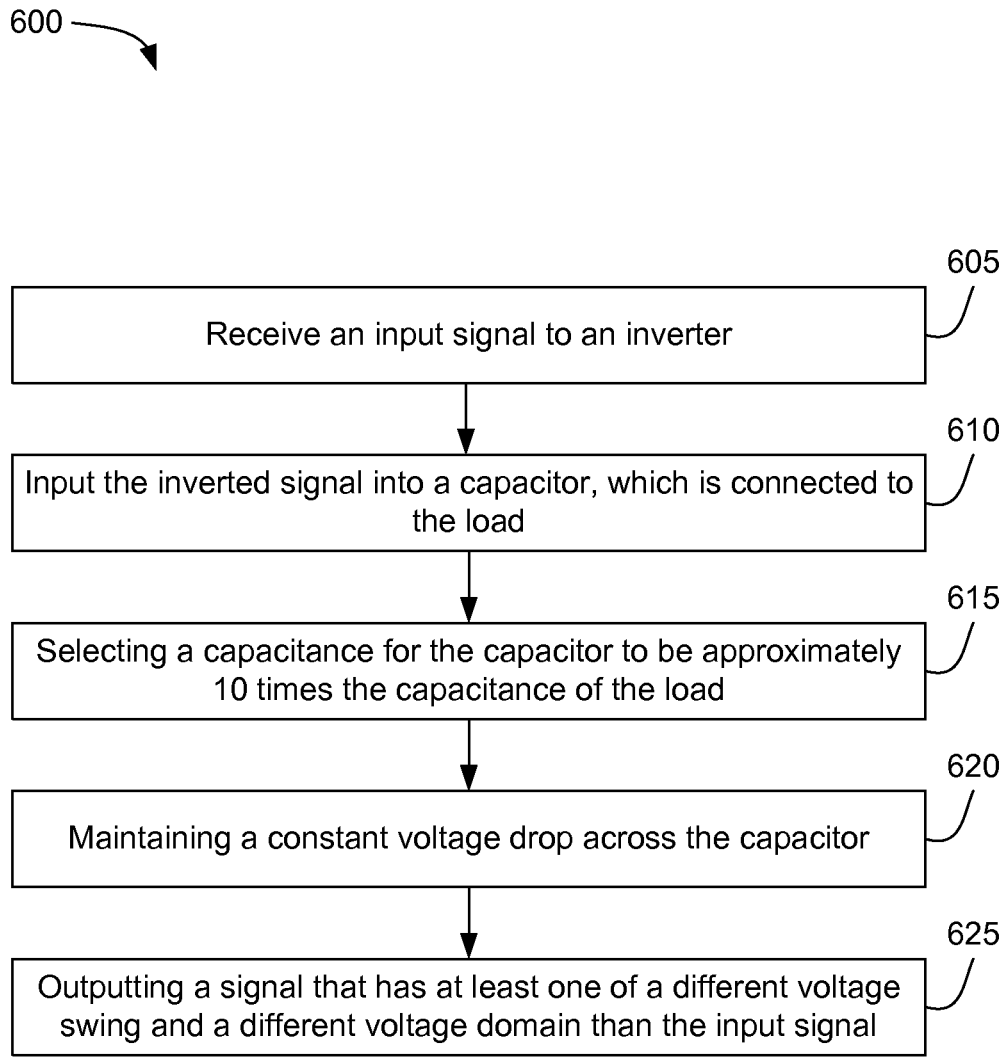
FIG. 6 depicts a flowchart diagram of one embodiment of a method of voltage level translation.

FIG. 6 depicts a flowchart diagram of one embodiment of a method 600 of voltage level translation. While the method 600 is described in conjunction with the voltage level translators of FIGS. 1 and 2, the method 600 may be used in conjunction with any voltage level translator according to the principles described herein.

An input signal is received 605 at the inverter 102. The inverter 102 outputs a signal with an inverted signal from the input signal. The inverted signal is input 610 into a capacitor, which is connected to a load 104. The capacitance for the capacitor is selected 615 to be approximately ten times the capacitance of the load 104. In one embodiment, the capacitance is at least eight times the capacitance of the load 104. In another embodiment, the capacitance is at least nine times the capacitance of the load 104. In another embodiment, the capacitance is at least ten times the capacitance of the load 104.

In one embodiment, the load 104 is a loading circuit at the output of the voltage level translator, as in the embodiment, of FIG. 1. The loading circuit has an associated capacitance. The capacitance is selected to be approximately ten times the capacitance of the loading circuit. In another embodiment, the load 104 is replaced by a transistor having a drain connected to the output, as in the embodiment of FIG. 2. The capacitance of the capacitor is selected to have approximately ten times or more the capacitance of the transistor. The capacitance ratio of the capacitor to the capacitance of the transistor ensures the proper operation of the transistor. A constant voltage drop is maintained 620 across the capacitor from the output of the inverter 102 to the gate of the transistor, which provides a constant/equal rise time and fall time.

The voltage level translator outputs 625 a signal that has at least one of a different voltage swing and a different voltage domain than the input signal. In one embodiment, the output signal has a different voltage swing than the input signal, but the same voltage domain. In another embodiment, the output signal has a different voltage domain than the input signal, but the same voltage swing. In another embodiment, the output signal has a different voltage swing and a different voltage domain than the input signal. The output signal may be periodic, based on the input signal.

An embodiment of the operation of a voltage level translator of FIG. 1 is described below:
3. The input signal and the output of the inverter have a first voltage swing equal to V1.
4. When the input signal is at its high level, the output of the inverter is at ground level. The drain of transistor M3 is also at ground level (V2).
5. The resistors R1 and R2 are chosen in such a way that the voltage across R2 is equal to the supply voltage of V1. Therefore the output signal is at V3-V1, and the voltage across the capacitor C1 is also V3-V1. The output signal is at its low level when the input signal is high.
6. When the input signal goes to its low level, the output of the inverter will go to high level (V1). Transistor M3 is now off, so the current through R1 is cut off.
7. Since the voltage on capacitor C1 does not change instantly, the voltage on the output signal will instantly be pushed to the supply voltage of V3 by the output of the inverter through capacitor C1, resulting in an output high level.
8. This voltage is maintained during this cycle, since there is no path to discharge the capacitor C1. The voltage across C1 is maintained at V3-V1.
9. When the input signal goes high again, the inverter output goes low, and the drain of transistor M3 will be pulled down to 0V by transistor M3.
10. Capacitor C1 pulls the output signal to V3-V1 instantly, resulting in an output low level.
11. The voltage across R2 is again equal to V1, and the voltage across C1 is maintained at V3-V1.
12. The propagation delay is very small—much less than 1 ns.
13. This circuit remains operational for a wide range of V3, as long as V3>V1.

An embodiment of the operation of a voltage level translator of FIG. 2 is described below:
1. V3 is higher than V1. V2 is ground.
2. When the input signal is high, the inverter output is low. The drain of transistor M3 is also at 0V. Transistor M4 is off.
3. The resistors R1 and R2 are chosen in such a way that the voltage across R2 is V1. Therefore the voltage across the capacitor C1 is V3-V1. The gate of transistor M5 is at V3-V1, and transistor M5 is on. Therefore, the output is high.
4. When the input signal goes low, the inverter output goes to V1, enough to turn transistor M4 fully on. Transistor M3 is now off, so the current through R1 is cut off.
5. Since the voltage on C1 does not change instantly, the voltage on the gate of M5 is pushed to V3 by the inverter output, turning M5 off. Therefore the output goes low.
6. The output voltage is maintained during this cycle. Since there is no path to discharge the capacitor C1, the voltage across C1 is maintained at V3-V1.

7. When the input signal goes high again, the inverter output goes to 0V, turning M4 off, and the drain of transistor M3 is pulled down to 0V by M3.
8. The voltage across R2 returns to V1, and the voltage across C1 is maintained at V3-V1.
9. The voltage at the gate of M5 is pulled down to V3-V1 again, enough to turn M5 on. The output goes high again.
10. The propagation delay is very small—less than 1 ns.
11. The circuit remains operational for different supply ratios as long as R1 and R2 are properly chosen.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A voltage level translator, comprising:
    an inverter circuit configured to switch an output of the inverter circuit between a first voltage level and a second voltage level;
    a capacitor connected to the output of the inverter circuit; and
    a load connected to the capacitor, wherein a capacitance of the capacitor is approximately 10 times larger than a capacitance of the load,
    wherein an output signal of the voltage level translator comprises at least one of a different voltage swing and a different voltage domain than an input signal to the inverter circuit.

2. The voltage level translator of claim 1, wherein a voltage drop across the capacitor from the output of the inverter circuit to the load is constant.

3. The voltage level translator of claim 1, wherein the capacitance of the capacitor is at least eight times larger than the capacitance of the load.

4. The voltage level translator of claim 1, wherein the capacitance of the capacitor is at least ten times larger than the capacitance of the load.

5. The voltage level translator of claim 1, further comprising:
    a first voltage source at the first voltage level;
    a second voltage source at the second voltage level, wherein the inverter circuit is driven by the input signal that switches the output of the inverter circuit at a predetermined interval; and
    a third voltage source, wherein the third voltage source comprises a third voltage level that is higher than the first voltage level and the second voltage level.

6. The voltage level translator of claim 5, further comprising:
    a first transistor comprising a gate of the first transistor connected to the output of the inverter circuit, wherein a source of the first transistor is connected to the second voltage source; and
    a second transistor comprising:
        a drain connected to a drain of the first transistor;
        a gate connected to the capacitor, wherein the capacitor is connected to the output of the inverter circuit; and
        a source connected to the third voltage source,
    wherein the output signal is configured to switch between the second voltage level and the third voltage level at the drains of the first transistor and the second transistor to produce a different voltage swing at the output signal than the input signal.

7. The voltage level translator of claim 6, further comprising:
    a third transistor comprising a gate connected to the input signal;
    a first resistor connected to the gate of the second transistor and the third voltage source; and
    a second resistor connected to a drain of the third transistor, wherein a source of the third transistor is connected to the second voltage source.

8. The voltage level translator of claim 5, further comprising:
    a first resistor connected to the third voltage source;
    a first transistor comprising a gate connected to the first voltage source, wherein the capacitor, the first resistor, and the load are connected to a drain of the first transistor;
    a second resistor connected to a source of the first transistor; and
    a second transistor comprising:
        a gate connected to the input signal;
        a drain connected to the source of the first transistor via the second resistor; and
        a source connected to the second voltage source,
    wherein the output signal is adjusted to the third voltage level to produce a different voltage domain at the output signal than the input signal.

9. The voltage level translator of claim 8, wherein the capacitance of the capacitor is selected based on a loading circuit connected at an output of the voltage level translator.

10. The voltage level translator of claim 8, wherein the voltage swing of the output signal is equal to the voltage swing of the input signal.

11. The voltage level translator of claim 1, wherein the voltage swing of the output signal of the voltage level translator is periodic.

12. A voltage level translator, comprising:
    an inverter comprising a pair of transistors, wherein the inverter is configured to switch an output of the inverter between a first voltage level and a second voltage level;
    a capacitor comprising a first end connected to the output of the inverter; and
    a first transistor comprising a gate connected to a second end of the capacitor, wherein a capacitance of the capacitor is approximately 10 times larger than a capacitance of the first transistor,
    wherein an output signal at a drain of the first transistor comprises a different voltage swing than an input signal to the inverter.

13. The voltage level translator of claim 12, wherein a voltage drop across the capacitor from the output of the inverter to the first transistor is constant.

14. The voltage level translator of claim 12, wherein the capacitance of the capacitor is at least ten times larger than the capacitance of the first transistor.

15. The voltage level translator of claim 12, further comprising:
a first voltage source at the first voltage level;
a second voltage source at the second voltage level, wherein the inverter is driven by the input signal that switches the output of the inverter between the first voltage level and the second voltage level; and
a third voltage source, wherein the third voltage source comprises a third voltage level that is higher than the first voltage level and the second voltage level.

16. The voltage level translator of claim 15, further comprising:
a second transistor comprising a gate of the second transistor connected to the output of the inverter, wherein a source of the second transistor is connected to the second voltage source,
wherein the first transistor further comprises:
a drain connected to a drain of the second transistor; and
a source connected to the third voltage source,
wherein the output signal is configured to switch between the second voltage level and the third voltage level at the drains of the first transistor and the second transistor to produce a different voltage swing at the output signal than the input signal.

17. A voltage level translator, comprising:
an inverter comprising a pair of transistors, wherein the inverter is configured to switch an output of the inverter between a first voltage level and a second voltage level; and
a capacitor comprising a first end connected to the output of the inverter and a second end connected to a load, wherein a capacitance of the capacitor is approximately 10 times larger than a capacitance of the load,
wherein an output signal at the load comprises a different voltage domain than an input signal to the inverter.

18. The voltage level translator of claim 17, wherein a voltage drop across the capacitor from the output of the inverter to the load is constant.

19. The voltage level translator of claim 17, further comprising:
a first voltage source at the first voltage level;
a second voltage source at the second voltage level, wherein the inverter is driven by the input signal that switches the output of the inverter between the first voltage level and the second voltage level; and
a third voltage source, wherein the third voltage source comprises a third voltage level that is higher than the first voltage level and the second voltage level.

20. The voltage level translator of claim 17, further comprising:
a first resistor connected to the third voltage source;
a first transistor comprising a gate connected to the first voltage source, wherein the capacitor, the first resistor, and the load are connected to a drain of the first transistor;
a second resistor connected to a source of the first transistor; and
a second transistor comprising:
a gate connected to the input signal;
a drain connected to the source of the first transistor via the second resistor; and
a source connected to the second voltage source,
wherein the output signal is adjusted to the third voltage level to produce a different voltage domain at the output signal than the input signal.

* * * * *